United States Patent
Kawashima et al.

(10) Patent No.: US 9,178,412 B2
(45) Date of Patent: Nov. 3, 2015

(54) BIDIRECTIONAL SWITCH CIRCUIT CONFIGURED TO CONDUCT CURRENT IN REVERSE DIRECTION WITHOUT APPLYING AN ON-DRIVE SIGNAL AND POWER CONVERTER INCLUDING THE SAME

(75) Inventors: Reiji Kawashima, Shiga (JP); Kazushi Hisayama, Shiga (JP); Hiroshi Hibino, Shiga (JP); Morimitsu Sekimoto, Shiga (JP); Toshiyuki Maeda, Shiga (JP); Sumikazu Matsuno, Shiga (JP)

(73) Assignee: Daikin Industries, Ltd., Osaka (JP)

( * ) Notice: Subject to any disclaimer, the term of this patent is extended or adjusted under 35 U.S.C. 154(b) by 135 days.

(21) Appl. No.: 12/922,034

(22) PCT Filed: Jan. 18, 2010

(86) PCT No.: PCT/JP2010/000222
§ 371 (c)(1),
(2), (4) Date: Sep. 10, 2010

(87) PCT Pub. No.: WO2010/082500
PCT Pub. Date: Jul. 22, 2010

(65) Prior Publication Data
US 2011/0026285 A1  Feb. 3, 2011

(30) Foreign Application Priority Data
Jan. 19, 2009 (JP) .................. 2009-009085

(51) Int. Cl.
*H02M 7/217* (2006.01)
*H02M 1/42* (2007.01)
*H02M 3/335* (2006.01)
(Continued)

(52) U.S. Cl.
CPC ........ *H02M 1/4208* (2013.01); *H02M 3/33576* (2013.01); *H03K 17/664* (2013.01); *H03K 17/6874* (2013.01); *H02M 5/458* (2013.01); *H03K 17/74* (2013.01);
(Continued)

(58) Field of Classification Search
CPC ............ H02M 3/335; H02M 3/33507; H02M 3/33569; H02M 3/33576; H02M 3/33584; H02M 1/4208
USPC ......... 323/234, 237, 265, 273–275, 282–285; 363/123–127
See application file for complete search history.

(56) References Cited

U.S. PATENT DOCUMENTS 4,500,802 A    2/1985  Janutka
4,728,825 A *  3/1988  Sugayama et al. ............ 327/434

(Continued)

FOREIGN PATENT DOCUMENTS

JP    61-203867 A    9/1986
JP    4-63475 A      2/1992

(Continued)

*Primary Examiner* — Jeffery Gblende
(74) *Attorney, Agent, or Firm* — Birch, Stewart, Kolasch & Birch, LLP

(57) ABSTRACT

A bidirectional switch circuit includes two switching elements connected to conduct a current in both directions. The two switching elements are connected in series to each other. Of the two switching elements, the switching element to which a reverse voltage is applied, a voltage of a source of one of the switching elements being higher than a voltage of a drain of the one, is configured to conduct a current from the source to the drain even when an on-drive signal is not being input to a gate terminal of the one.

13 Claims, 13 Drawing Sheets

(51) Int. Cl.
*H03K 17/66* (2006.01)
*H03K 17/687* (2006.01)
*H02M 5/458* (2006.01)
*H03K 17/74* (2006.01)

(52) U.S. Cl.
CPC ............ *H03K 2217/0009* (2013.01); *H03K 2217/0081* (2013.01); *Y02B 70/126* (2013.01)

(56) References Cited

U.S. PATENT DOCUMENTS

| | | | |
|---|---|---|---|
| 5,003,246 A * | 3/1991 | Nadd | 323/349 |
| 5,105,251 A * | 4/1992 | Nakayama | 257/367 |
| 2002/0064012 A1* | 5/2002 | Chung | 361/100 |
| 2005/0106828 A1* | 5/2005 | You et al. | 438/305 |
| 2006/0252394 A1* | 11/2006 | Suwa et al. | 455/201 |
| 2007/0252178 A1 | 11/2007 | Onose | |
| 2008/0007243 A1* | 1/2008 | Matsumoto et al. | 323/313 |
| 2008/0143421 A1* | 6/2008 | Yanagihara et al. | 327/427 |
| 2008/0278116 A1 | 11/2008 | Matsunaga | |
| 2008/0278972 A1 | 11/2008 | Kimura | |
| 2009/0059633 A1* | 3/2009 | Hara et al. | 363/126 |
| 2010/0090259 A1 | 4/2010 | Masuda et al. | |
| 2010/0097105 A1 | 4/2010 | Morita et al. | |

FOREIGN PATENT DOCUMENTS

| | | |
|---|---|---|
| JP | 6-78526 A | 3/1994 |
| JP | 8-32060 A | 2/1996 |
| JP | 2000-269354 A | 9/2000 |
| JP | 2001-345684 A | 12/2001 |
| JP | 2004-101151 A | 4/2004 |
| JP | 2005-20799 A | 1/2005 |
| JP | 2007-215389 A | 8/2007 |
| JP | 2007-526633 A | 9/2007 |
| JP | 2007-294716 A | 11/2007 |
| JP | 2008-147923 A | 6/2008 |
| JP | 2008-153445 A | 7/2008 |
| JP | 2008-283819 A | 11/2008 |
| WO | WO 00/13290 A1 | 3/2000 |
| WO | WO 2005/079370 A2 | 9/2005 |
| WO | WO 2006/112275 A1 | 10/2006 |
| WO | WO 2008/062800 A1 | 5/2008 |

* cited by examiner (A)

(B)

(A)

(B)

US 9,178,412 B2

BIDIRECTIONAL SWITCH CIRCUIT CONFIGURED TO CONDUCT CURRENT IN REVERSE DIRECTION WITHOUT APPLYING AN ON-DRIVE SIGNAL AND POWER CONVERTER INCLUDING THE SAME

TECHNICAL FIELD

The present invention relates to bidirectional switch circuits in which two switching elements are connected in series to conduct a current in both directions.

BACKGROUND ART

There are conventionally known bidirectional switch circuits in which two switching elements are connected to conduct a current in both directions. In such bidirectional switch circuits, as described in, for example, PATENT DOCUMENTS 1 and 2, switching elements, such as IGBTs, MOSFETs, or the like, which include antiparallel diodes may be connected so that the antiparallel diodes are oriented in opposite directions, or a pair of reverse blocking IGBTs may be connected in antiparallel.

The aforementioned bidirectional switch circuits are used in, for example, a switching circuit for a matrix converter described in PATENT DOCUMENT 2, a power factor improvement circuit for a power conversion circuit described in PATENT DOCUMENT 3, and the like.

Citation List

Patent Document

PATENT DOCUMENT 1: Japanese Patent Publication No. 2008-283819
PATENT DOCUMENT 2: Japanese Patent Publication No. 2005-20799
PATENT DOCUMENT 3: Japanese Patent Publication No. 2004-101151

SUMMARY OF THE INVENTION

Technical Problem

However, when a bidirectional switch circuit is configured using switching elements each of which includes antiparallel diodes, the number of parts proportionately increases, and therefore, the circuit is complicated and the conduction loss increases.

In contrast to this, as described in PATENT DOCUMENT 1, a pair of reverse blocking IGBTs may be connected in antiparallel instead of antiparallel diodes, for example. In this case, however, it is necessary to control the driving of a plurality of switching elements in a well-coordinated manner in order to reduce or prevent damage of the switching elements due to a reverse voltage (a state in which the source voltage is higher than the drain voltage), resulting in a complicated control.

The present invention has been made in view of the aforementioned problems. It is an object of the present invention to provide a bidirectional switch circuit in which two switching elements are connected to conduct a current in both directions, and in which the bidirectional conduction is achieved by simply controlling the driving of the switching elements while the circuit is simplified and the conduction loss is reduced by reducing the number of parts.

Solution to the Problem

To achieve the object, in a bidirectional switch circuit (30) according to the present invention, of switching elements (SW1, SW2), the switching element (SW1) to which a reverse voltage is applied is configured to conduct a current in a reverse direction even when an on-drive signal is not being input to a gate terminal (G1) of one of the switching elements (SW1, SW2).

Specifically, a first invention is directed to a bidirectional switch circuit including two switching elements (SW1, SW2) connected to conduct a current in both directions. The two switching elements (SW1, SW2) are connected in series to each other. Of the two switching elements (SW1, SW2), the switching element (SW1) to which a reverse voltage is applied, a voltage of a source (S1) of one of the switching elements (SW1, SW2) being higher than a voltage of a drain (D) of the one, is configured to conduct a current from the source (S1) to the drain (D) even when an on-drive signal is not being input to a gate terminal (G1) of the one.

With the aforementioned configuration, the switching element (SW1) to which the reverse voltage is applied (the voltage of the source (S1) is higher than the voltage of the drain (D)) allows a current to flow from the source (S1) to the drain (D) even when the drive control is not being input. Therefore, the freewheeling diode is no longer required, and it is no longer necessary to control the driving of a plurality of switching elements. Therefore, with the aforementioned configuration, the number of parts in the bidirectional switch circuit (30) is reduced, whereby the circuit configuration can be simplified and the conduction loss can be reduced. Moreover, with the aforementioned configuration, it is no longer necessary to control the driving of all the switching elements in the bidirectional switch circuit (30), whereby the control is facilitated.

In the aforementioned configuration, the bidirectional switch circuit may further include a gate drive circuit (33) configured to control the driving of the switching element (SW1) to which the reverse voltage is applied. The gate drive circuit (33) may include a resistance material (44) connected between the source (S1) and the gate terminal (G1) of the switching element (SW1) and in parallel to the switching element (SW1) (second invention).

Because the resistance material (44) connected between the source (S1) and the gate terminal (G1) of the switching element (SW1) and in parallel to the switching element (SW1) is thus provided, almost all the voltage between the source (S1) and the drain (D) is applied between the gate terminal (G1) and the drain (D). Therefore, with the aforementioned configuration, the voltage between the gate terminal (G1) and the drain (D) can be efficiently increased to a threshold voltage (Vt) at which the switching element (SW1) starts to be in the on state, as quickly as possible, whereby the switching element (SW1) can be switched on in the reverse direction (a current is allowed to pass from the source terminal to the drain).

Moreover, by providing the resistance material (44), it is possible to prevent a high voltage which exceeds the breakdown voltage from being applied between the source (S1) and the gate terminal (G1), whereby a breakdown between the source (S1) and gate terminal (G1) of the switching element (SW1) can be prevented.

The switching element (SW1') to which the reverse voltage is applied preferably include a gate-drain body diode (Dgd1) provided between the gate terminal (G1) and the drain (D) and configured to allow a current to flow only from the gate terminal (G1) to the drain (D). The switching element (SW1')

is preferably configured so that a threshold voltage (Vt) at which the switching element (SW1') starts to be in an on state is lower than a forward voltage (Vf) of the gate-drain body diode (Dgd1) (third invention).

As a result, a current does not flow through the gate-drain body diode (Dgd1) formed between the gate terminal (G1) and the drain (D), and the switching element (SW1') is switched on by the voltage between the gate terminal (G1) and the drain (D), whereby a current flows through the switching element (SW1'). Here, when a current flows through the gate-drain body diode (Dgd1) of the switching element (SW1'), a small number of carriers are accumulated in the body diode (Dgd1), and therefore, a delay occurs when turning off and a larger loss occurs than when a current flows through the switching element (SW1'). As described above, however, a current is caused to flow through the switching element (SW1') without causing a current to flow through the body diode (Dgd1), whereby the delay and loss when turning off can be reduced or prevented.

The switching element (SW1') to which the reverse voltage is applied preferably includes a gate-drain body diode (Dgd1) provided between the gate terminal (G1) and the drain (D) and configured to allow a current to flow only from the gate terminal (G1) to the drain (D), and a gate drive circuit (51) configured to control the driving of the switching element (SW1'). The gate drive circuit (51) includes a gate voltage adjuster (54) configured to adjust a gate-drain voltage (Vgd) between the gate terminal (G1) and the drain (D) so that the gate-drain voltage (Vgd) is lower than a forward voltage (Vf) of the gate-drain body diode (Dgd1) (fourth invention).

As a result, the gate-drain voltage (Vgd) between the gate terminal (G1) and the drain (D) can be more reliably caused to be lower than the forward voltage Vf of the gate-drain body diode (Dgd1) formed between the gate terminal (G1) and the drain (D), whereby a current can be more reliably prevented from flowing through the gate-drain body diode (Dgd1).

The bidirectional switch circuit preferably further includes two gate drive circuits (33, 34) configured to control the driving of the two respective switching elements (SW1, SW2). The gate drive circuits (33, 34) are preferably configured to input the same drive signal to the gate terminals (G1, G2) of the respective switching elements (SW1, SW2) (fifth invention).

As a result, it is no longer necessary to change the content or input timing of the drive signal for the switching elements (SW1, SW2) separately, whereby it is easier to control the driving of the switching elements (SW1, SW2).

Note that, as in the aforementioned configuration, when a drive signal is simultaneously input to the two switching elements (SW1, SW2), the switching elements (SW1, SW2) may be switched on at different timings due to variations in a characteristic of the switching elements (SW1, SW2) or the like, likely leading to the breakdown of a switching element to which the reverse voltage is applied. However, by employing the switching elements (SW1, SW2) having the configuration in which a current flows in the reverse direction even when the drive signal input to the gate terminal (G1) is off as in the first invention, the breakdown of the switching element (SW1, SW2) to which the reverse voltage is applied can be prevented.

The bidirectional switch circuit preferably further includes a control circuit (30) configured to output an off-control signal to the switching element (SW1) to which the reverse voltage is applied (sixth invention). As a result, while a current flows in the reverse direction through the switching element (SW1) to which the reverse voltage is applied, the forward current of the switching element (SW1) can be reliably blocked by the switching element (SW1). Thus, with the aforementioned configuration, the bidirectional switch circuit (30) whose conduction directions are more reliably switched is obtained.

The two switching elements (SW1, SW2) are preferably provided in a single device including two gate electrodes (seventh invention). As a result, the two switching elements (SW1, SW2) can share a drain terminal, whereby the chip area of the device can be proportionately reduced. Therefore, the loss of the bidirectional switch circuit (30) can be reduced.

In the bidirectional switch circuit of the seventh invention, a distance between the two gate electrodes is preferably greater than distances between the gate electrodes and the respective corresponding source electrodes (eighth invention). As a result, the distance between the two gate electrodes contributing to the voltage withstanding capability of the switching elements (SW1, SW2) can be increased.

Ninth to twelfth inventions are directed to power converters. Specifically, in the eighth invention, a power converter is a matrix converter (60) including the bidirectional switch circuit of any one of the first to fourth inventions as a switching unit (ninth invention). With this configuration, advantages similar to those of the first to fourth inventions can be obtained in the matrix converter (60). In particular, in the ninth invention, two switching elements (Sur1, Sur2) constituting the switching unit of the matrix converter (60) are preferably provided in a single device having two gate electrodes (tenth invention). As a result, advantages similar to those of the seventh invention can be obtained in the matrix converter (60). In the tenth invention, a distance between the two gate electrodes is preferably greater than distances between the gate electrodes and the respective corresponding source electrodes (eleventh invention). As a result, the distance between the two gate electrodes contributing to the voltage withstanding capability of the switching elements (SW1, SW2) can be increased.

In the tenth invention, a power converter (1, 1') may include the bidirectional switch circuit of any one of the first to eighth inventions as a switching unit (twelfth invention). With this configuration, the power converter (1, 1') including a bidirectional switch circuit, such as a power factor improvement circuit or the like, can obtain advantages similar to those of the first to seventh inventions.

Advantages of the Invention

As described above, according to the first invention, of the two switching elements (SW1, SW2) connected in series, the switching element (SW1) to which the reverse voltage is applied, is configured to conduct a current in the reverse direction even when the on-drive signal is not being input to the gate terminal (G1). Therefore, the number of parts is reduced, whereby the circuit configuration can be simplified and the conduction loss can be reduced, and a plurality of switching elements can be easily controlled.

According to the second invention, the gate drive circuit (33) of the switching element (SW1) includes the resistance material (44) connected between the source (S1) and the gate terminal (G1) and in parallel to the switching element (SW1). Therefore, a voltage which exceeds the breakdown voltage can be prevented from being applied between the source (S1) and the gate terminal (G1), and the switching element (SW1) can be efficiently switched on.

According to the third invention, the switching element (SW1') includes the gate-drain body diode (Dgd1) between the gate terminal (G1) and the drain (D), and the threshold voltage Vt at which the switching element (SW1') starts to be in the on state is lower than the forward voltage (Vf) of the body diode (Dgd1). Therefore, the reverse current can be caused to flow through the switching element (SW1') without flowing through the body diode (Dgd1), whereby an increase in the delay and loss when turning off can be reduced or prevented.

According to the fourth invention, the switching element (SW1') includes the gate-drain body diode (Dgd1) between the gate terminal (G1) and the drain (D), and adjusts the voltage Vgd between the gate terminal (G1) and the drain (D) so that the voltage (Vgd) is lower than the forward voltage (Vf) of the body diode (Dgd1). Therefore, a current can be more reliably prevented from flowing through the body diode (Dgd1).

According to the fifth invention, the gate drive circuits (33, 34) are configured to input the same drive signal to the gate terminals (G1, G2) of the switching elements (SW1, SW2). Therefore, the driving of the switching elements (SW1, SW2) can be easily controlled.

According to the sixth invention, the off-control signal is output to the switching element (SW1) to which the reverse voltage is applied. Therefore, the forward current of the the switching element (SW1) can be blocked, resulting in the bidirectional switch circuit (30) capable of more reliably switching conduction bidirectionally.

According to the seventh invention, the switching elements (SW1, SW2) are provided in a single device. Therefore, the chip area of the device can be reduced, thereby reducing the loss.

According to the eighth invention, the distance between the two gate electrodes can be increased. Therefore, the breakdown voltage between the two source terminals, i.e., between the drain and the source, can be increased.

According to the ninth invention, the matrix converter (60) includes the bidirectional switch circuit of any one of the first to fourth inventions as a switching unit. Therefore, even in the matrix converter (60), advantages similar to those of the first to fourth inventions can be obtained. In particular, also in the matrix converter (60), by providing the switching elements (Sur1, Sur2) in a single device as in the tenth invention, advantages similar to those of the seventh invention can be obtained. According to the eleventh invention, the distance between the two gate electrodes can be increased, whereby advantages similar to those of the eighth invention can be obtained.

According to the twelfth invention, the power converter (1, 1') includes the bidirectional switch circuit of any one of the first to eighth inventions as a switching unit. Therefore, advantages similar to those of the first to eighth invention can be obtained.

BRIEF DESCRIPTION OF THE DRAWINGS

FIG. 1 is a diagram schematically showing a configuration of a power converter according to a first embodiment.

FIG. 2(A) is a diagram schematically showing a configuration of a dual-gate type device which is a bidirectional switch, and FIG. 2(B) is a diagram showing an example circuit symbol indicating the dual-gate type device.

FIG. 3 is a diagram schematically showing a configuration of a drive circuit of a bidirectional switch.

FIG. 4 is a time chart showing operation and states of the drive circuit.

FIG. 5 is a time chart showing operation and states of the bidirectional switch.

FIG. 6 is a diagram schematically showing a configuration of a power converter according to a first variation of the first embodiment.

FIG. 7 is a time chart showing a driven state of a bidirectional switch in the power converter of the first variation.

FIG. 8 is a counterpart of FIG. 3 showing a power converter according to a second variation of the first embodiment.

FIG. 9 is a counterpart of FIG. 3 showing a power converter according to a third variation of the first embodiment.

FIG. 10 is a diagram schematically showing a configuration of a bidirectional switch in a power converter according to a fourth variation of the first embodiment.

FIG. 11 is a diagram schematically showing a configuration of a power converter according to a second embodiment.

FIG. 12(A) is a diagram showing a state of the power converter of the second embodiment in which a current flows between an R phase and a T phase, and FIG. 12(B) is a diagram showing a state of the power converter of the second embodiment in which a current flows between an S phase and the T phase.

FIG. 13 is a diagram schematically showing a configuration of a conventional bidirectional switch.

FIG. 14 is a diagram showing a configuration of another conventional bidirectional switch.

FIG. 15(A) is a diagram showing switching patterns and conduction states of the conventional bidirectional switch, where Iu>0, and FIG. 15(B) is a diagram showing switching patterns and conduction states of the conventional bidirectional switch, where Iu<0.

FIG. 16 is a diagram schematically showing a configuration of a bidirectional switch in the power converter of the second embodiment.

FIG. 17 is a counterpart of FIG. 15 showing the bidirectional switch of the second embodiment.

DESCRIPTION OF EMBODIMENTS

Embodiments of the present invention will be described hereinafter with reference to the accompanying drawings. Note that the preferred embodiments described below are only for the illustrative purposes, and are not intended to limit the applications and uses of the present invention.

First Embodiment

Figure 1:
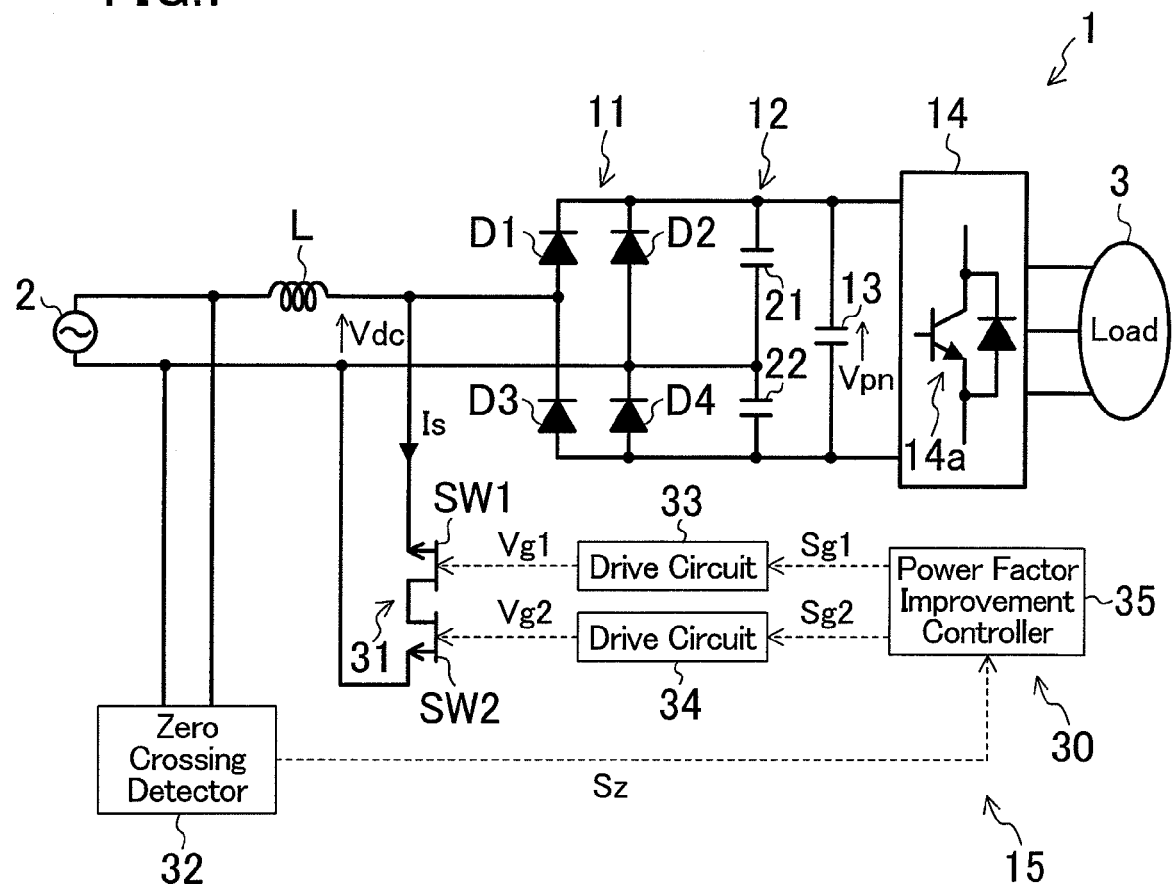
[FIG. 1]

FIG. 1 shows an example circuit of a power converter (1) according to a first embodiment of the present invention. The power converter (1) includes a converter circuit (11), a voltage doubler circuit (12), a smoothing capacitor (13), an inverter circuit (14), and a power factor improvement circuit (15). The power converter (1) is configured to convert an alternating voltage supplied from an alternating-current power supply (2) to a voltage having a predetermined frequency, and supply the resultant voltage to a load (3), such as a three-phase alternating-current motor or the like.

The converter circuit (11) is connected to the alternating-current power supply (2) and is configured to rectify an alternating voltage to a direct current. The converter circuit (11) is a diode bridge circuit in which a plurality of (four in the example of FIG. 1) diodes (D1-D4) are connected in a bridge configuration, and which is connected to the alternating-current power supply (2) via a reactor (L). As a result, the alternating voltage of the alternating-current power supply (2) is converted to a direct voltage by the bridge circuit of the diodes (D1-D4).

The voltage doubler circuit (12) includes two capacitors (21, 22) connected in series. In the voltage doubler circuit (12), one end of the alternating-current power supply (2) is connected between the capacitors (21, 22) via the converter circuit (11), whereby the capacitors (21, 22) can be charged so that a voltage between both ends of the serial circuit of the capacitors (21, 22) is twice as high as the voltage of the alternating-current power supply (2).

The smoothing capacitor (13) smoothes the direct voltage obtained by rectification performed by the converter circuit (11) and the voltage doubler circuit (12).

The inverter circuit (14) as well as the voltage doubler circuit (12) and the smoothing capacitor (13) are connected in parallel to the converter circuit (11). The inverter circuit (14) includes a plurality of switching elements (14a) (e.g., six in the case of three-phase alternating-current) are connected in a bridge configuration. Specifically, although not shown, the inverter circuit (14) includes three switching legs in each of which two switching elements (14a, 14a) are connected in series to each other are connected in parallel. By on-off operation of the switching elements (14a), a direct voltage is converted to an alternating voltage, which is then supplied to the load (3). Although, in this embodiment, as shown in FIG. 1, each switching element (14a) includes a transistor and a diode which are connected in antiparallel, the present invention is not limited to this. Any other configuration which achieves switching may be employed.

The power factor improvement circuit (15) includes a bidirectional switch circuit (30) including a bidirectional switch (31) which conducts a current in both directions. In the power factor improvement circuit (15), both ends of the bidirectional switch (31) are connected to the alternating-current power supply (2) so that a short circuit can be caused in the alternating-current power supply (2). The power factor improvement circuit (15) is configured to control the driving of the bidirectional switch (31), depending on the polarity of the voltage of the alternating-current power supply (2), to cause a short circuit in the alternating-current power supply (2) to rectify an input current Is of the power factor improvement circuit (15) in combination with the reactor (L), thereby improving the power factor of the power supply and controlling the magnitude of a voltage Vpn.

Specifically, the power factor improvement circuit (15) includes the bidirectional switch circuit (30), and a zero crossing detector (32) which outputs to the switch circuit (30) a zero crossing signal Sz corresponding to the polarity of the voltage of the alternating-current power supply (2). The zero crossing detector (32) is configured to generate and output the zero crossing signal Sz whose on/off is reversed at half cycles, depending on the waveform of the alternating voltage of the alternating-current power supply (2).

The bidirectional switch circuit (30) includes the bidirectional switch (31) configured to conduct a current in both directions, drive circuits (33, 34) which output drive signals Vg1 and Vg2 to the bidirectional switch (31) to drive the bidirectional switch (31), and a power factor improvement controller (35) (controller) which outputs control signals Sg1 and Sg2 to the drive circuits (33, 34). The power factor improvement controller (35) is configured to, when receiving the zero crossing signal Sz output from the zero crossing detector (32), output to the drive circuits (33, 34) the control signals Sg1 and Sg2 for controlling the driving of the bidirectional switch (31) based on the zero crossing signal Sz.

Figure 2:
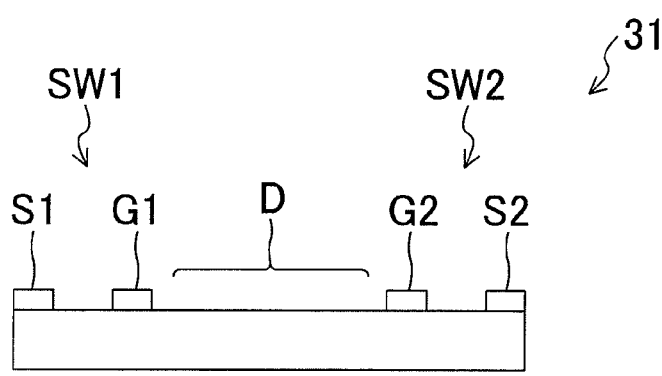
[FIG. 2]
Figure 2:
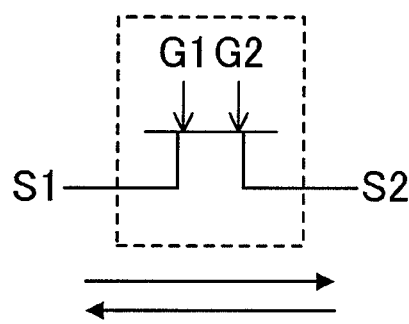

The bidirectional switch (31) includes two switching elements (SW1, SW2) which are connected in series so that the drains thereof are coupled to each other, and is configured to conduct a current in both directions by the drive circuits (33, 34) controlling the driving of the switching elements (SW1, SW2). The switching elements (SW1, SW2) include, for example, a junction field-effect transistor, a static induction transistor, a metal-semiconductor field-effect transistor, a heterojunction field-effect transistor, a high electron mobility transistor, or the like. The switching elements (SW1, SW2) are configured so that when a voltage higher than that of the drain is applied to the source (the higher voltage applied to the source is also referred to as a reverse voltage hereinafter), then even if an on-drive signal is not input to the gate terminal, a current flows from the source to the drain. Note that, as shown in FIG. 2(A), the switching elements (SW1, SW2) may be configured as a so-called dual-gate type device which includes two source terminals (S1, S2) and two gate terminals (G1, G2), and a single common drain, or alternatively, may be configured as two separate devices. Note that FIG. 2(B) shows an example circuit symbol, where the switching elements (SW1, SW2) are configured as the so-called dual-gate type device. In the dual-gate type switching elements (SW1, SW2), the distance between the two gate electrodes is preferably greater than the distances between the gate electrodes and the respective corresponding source electrodes. Specifically, in the example of FIG. 2(A), it is preferable that the distance between the source (S1) and the gate (G1)<the distance between the gate (G1) and the gate (G2), and the distance between the source (S2) and the gate (G2)<the distance between the gate (G1) and the gate (G2). This is because, in the dual-gate type device, the breakdown voltage between the two source terminals (S1, S2) depends on the breakdown voltage between the two gate terminals (G1, G2), and by setting the electrode-electrode distances as described above, a sufficient level of voltage withstanding capability is ensured.

Here, the switching elements (SW1, SW2) have an on-state resistance Ron which is set so that an on-state voltage generated by a reverse current flowing from the source to the drain is higher than a threshold voltage Vt at which the switching elements (SW1, SW2) start to be in the on state. As a result, the gate-drain voltage can be caused to quickly reach the threshold voltage Vt or more. Therefore, the switching elements (SW1, SW2) can be more quickly driven to turn on, whereby a loss caused when a current flows can be reduced. Note that, in transistors, such as junction field-effect transistors, static induction transistors, and the like, the threshold voltage is lower than or equal to 2.5 V, and therefore, the on-state resistance can be caused to be relatively small, whereby the conduction loss of the switching element can be reduced even when the switching element is configured so that the on-state voltage is higher than or equal to the threshold voltage.

As a result, as described in detail later, of the switching elements (SW1, SW2), the switching element (SW1) in which a higher voltage is applied to the source is allowed to conduct a current in the reverse direction by the reverse voltage applied to the switching element (SW1) even without controlling the driving of the switching element (SW1) so that the switching element (SW1) is switched on. Therefore, in this embodiment, the driving of only the switching element (SW1) in which a voltage higher than that of the source is applied to the drain, is controlled.

—Drive Circuit—

Figure 3:
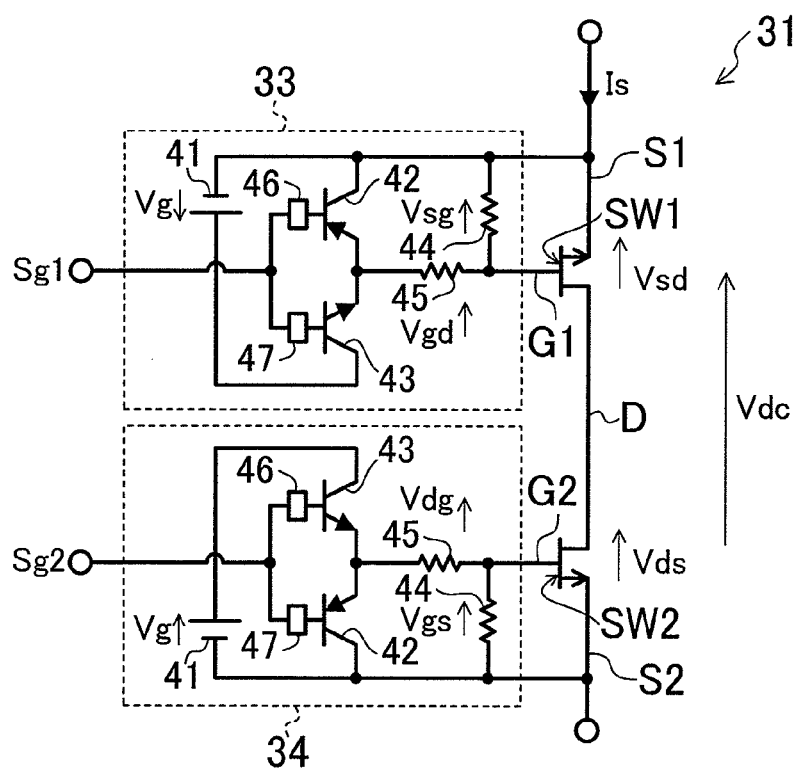
[FIG. 3]

A configuration of the drive circuits (33, 34) which control the driving of the switching elements (SW1, SW2) having the aforementioned configuration will be described hereinafter with reference to FIG. 3. Note that, as shown in FIG. 3, the drive circuits (33, 34) have the same configuration, and therefore, only the configuration of the drive circuit (33) will be described hereinafter, and the same components of the drive circuit (34) as those of the drive circuit (33) are indicated by the same reference characters.

The drive circuit (33) includes a drive power supply (41) which applies a voltage Vg between the gate (G) and source (S1) of the switching element (SW1), two gate drive switching elements (42, 43) which perform switching operation in accordance with a control signal Sg1 output from the power factor improvement controller (35), and a resistor (44) (resistance material) connected between the gate (G) and source (S1) of the switching element (SW1) and in parallel to the switching element (SW1).

The gate drive switching elements (42, 43) are connected in series to each other, and the gate terminal (G1) of the switching element (SW1) is connected between the switching elements (42, 43). The gate drive switching element (43) is provided between the drive power supply (41) and the gate terminal (G1) of the switching element (SW1) to form a voltage supply circuit in which the voltage Vg of the drive power supply (41) is applied to the gate terminal (G1) of the switching element (SW1) when the switching element (43) is in the on state. On the other hand, the gate drive switching element (42) is provided to couple the source (S1) and gate terminal (G1) of the switching element (SW1) when the switching element (42) is in the on state. Note that, in FIG. 3, a reference character 45 indicates a resistor for adjusting the switching rate of the switching element (SW1), which is provided between the gate drive switching elements (42, 43) and the gate terminal (G1) of the switching element (SW1).

The driving of the gate drive switching elements (42, 43) connected in series is controlled by drive controllers (46, 47), respectively, in accordance with the control signal Sg1 output from the power factor improvement controller (35) so that when one of the gate drive switching elements (42, 43) is in the on state, the other is in the off state, and when one of the gate drive switching elements (42, 43) is in the off state, the other is in the on state.

As a result, when the gate drive switching element (43) and the gate drive switching element (42) are switched on and off, respectively, in accordance with the control signal Sg1, the voltage Vg of the drive power supply (41) is applied to the gate terminal (G1) of the switching element (SW1) to drive the switching element (SW1). Specifically, in this case, an on-drive signal Vg1 is input from the drive circuit (33) to the gate terminal (G1) of the switching element (SW1).

Conversely, when the gate drive switching element (42) and the gate drive switching element (43) are switched on and off, respectively, in accordance with the control signal Sg1, the switching element (SW1) is switched off without the voltage Vg of the drive power supply (41) being applied to the gate terminal (G1) of the switching element (SW1). Specifically, in this case, an off-control signal is input, rather than the on-drive signal, from the drive circuit (33) to the gate terminal (G1) of the switching element (SW1).

The resistor (44) which is provided between the gate (G1) and source (S1) of the switching element (SW1) and in parallel to the switching element (SW1), has a resistance value which is sufficiently smaller than that of the switching element so that when the reverse voltage is applied to the switching element (SW1), almost all the reverse voltage is applied between the gate (G1) and drain (D) of the switching element (SW1). Specifically, the resistor (44) is configured to have a sufficiently small resistance value so that the reverse voltage is applied to the gate (G1) and drain (D) of the switching element (SW1) while almost no voltage is applied between the source (S1) and gate (G1) of the switching element (SW1) parallel to the resistor (44).

—Operation of Bidirectional Switch Circuit—

Operation of the bidirectional switch circuit (30) having the aforementioned configuration will be described hereinafter with reference to FIGS. 1-5.

Firstly, operation of the drive circuits (33, 34) which drive the switching elements (SW1, SW2) of the bidirectional switch (31) in the bidirectional switch circuit (30) will be described.

Figure 4:
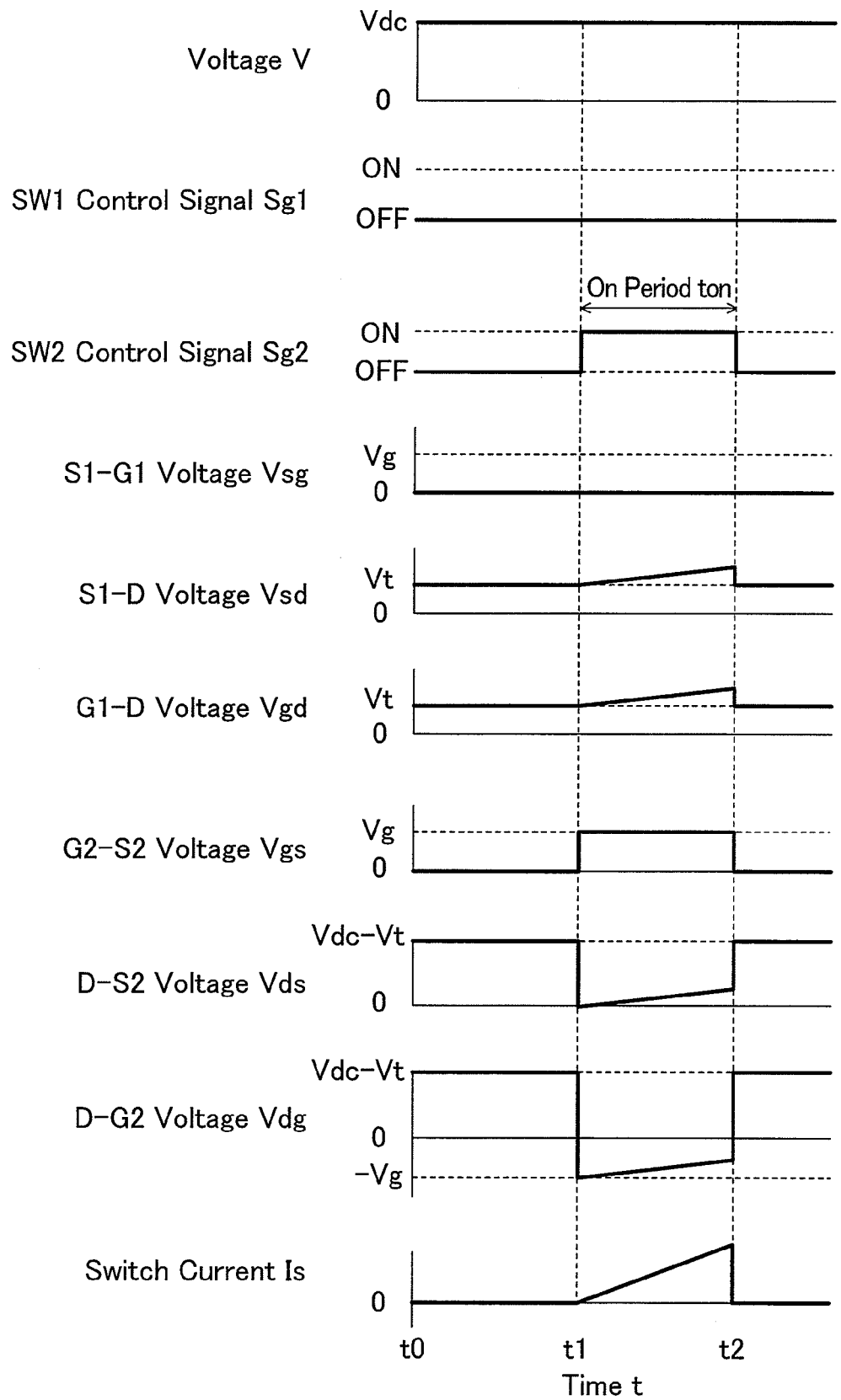
[FIG. 4]

As shown in FIGS. 3 and 4, at t=t0, in the bidirectional switch (31), when a reverse power supply voltage Vdc (a state in which the voltage of the source (S1) is higher than the voltage of the drain (D)) is applied to the switching element (SW1), almost all the voltage applied to the switching element (SW1) is applied between the gate (G1) and the drain (D) because of the resistor (44) provided in the drive circuit (33) for the switching element (SW1). In this case, while a voltage Vsg between the source (S1) and the gate (G1) is almost zero, a voltage Vsd between the source (S1) and the drain (D) and a voltage Vgd between the gate (G1) and the drain (D) are maintained equal to the threshold voltage Vt at which the switching element (SW1) starts to be in the on state. Thus, only a voltage which is equal to the threshold voltage Vt is applied to the switching element (SW1) which is one of the two switch elements of the bidirectional switch (31), and therefore, the differential voltage Vdc−Vt is applied to the other switching element (SW2) of the bidirectional switch (31). Note that, in the switching element (SW2), because the on-drive signal is not input, a voltage Vgs between the gate (G1) and the source (S2) is zero, and therefore, all the voltage Vdc−Vt is applied between the drain (D) and the gate (G2).

Next, at t=t1, when a control signal Sg2 which is in the on state is input to the drive circuit (34) of the switching element (SW2), the gate drive switching element (43) of the drive circuit (34) is switched on, so that the voltage Vg is applied from the drive power supply (41) to the gate terminal (G2) of the switching element (SW2). In this case, the switching element (SW2) is switched on, so that the current Is flows through the bidirectional switch (31). Specifically, a period during which the switching element (SW2) is in the on state is an on period ton.

Here, a voltage Vds between the drain (D) and source (S2) of the switching element (SW2) temporarily becomes zero when the switching element (SW2) is switched on, and thereafter, gradually increases with a current flowing through the switching element (SW2). On the other hand, also in the switching element (SW1), the voltage Vsd between the source (S1) and the drain (D) and the voltage Vgd between the gate (G1) and the drain (D) gradually increase with the current flowing through the switching element (SW2).

Next, at t=t2, when the control signal Sgt input to the drive circuit (34) for the switching element (SW2) is caused to be off, the gate drive switching element (43) of the drive circuit (34) is switched off, so that the voltage Vg of the drive power supply (41) is not applied to the gate terminal (G1) of the switching element (SW2), and therefore the voltage Vgs between the gate (G2) and the source (S2) becomes zero. In this case, the voltages of the switching elements (SW1, SW2) are the same as they were at t=t0.

Figure 5:
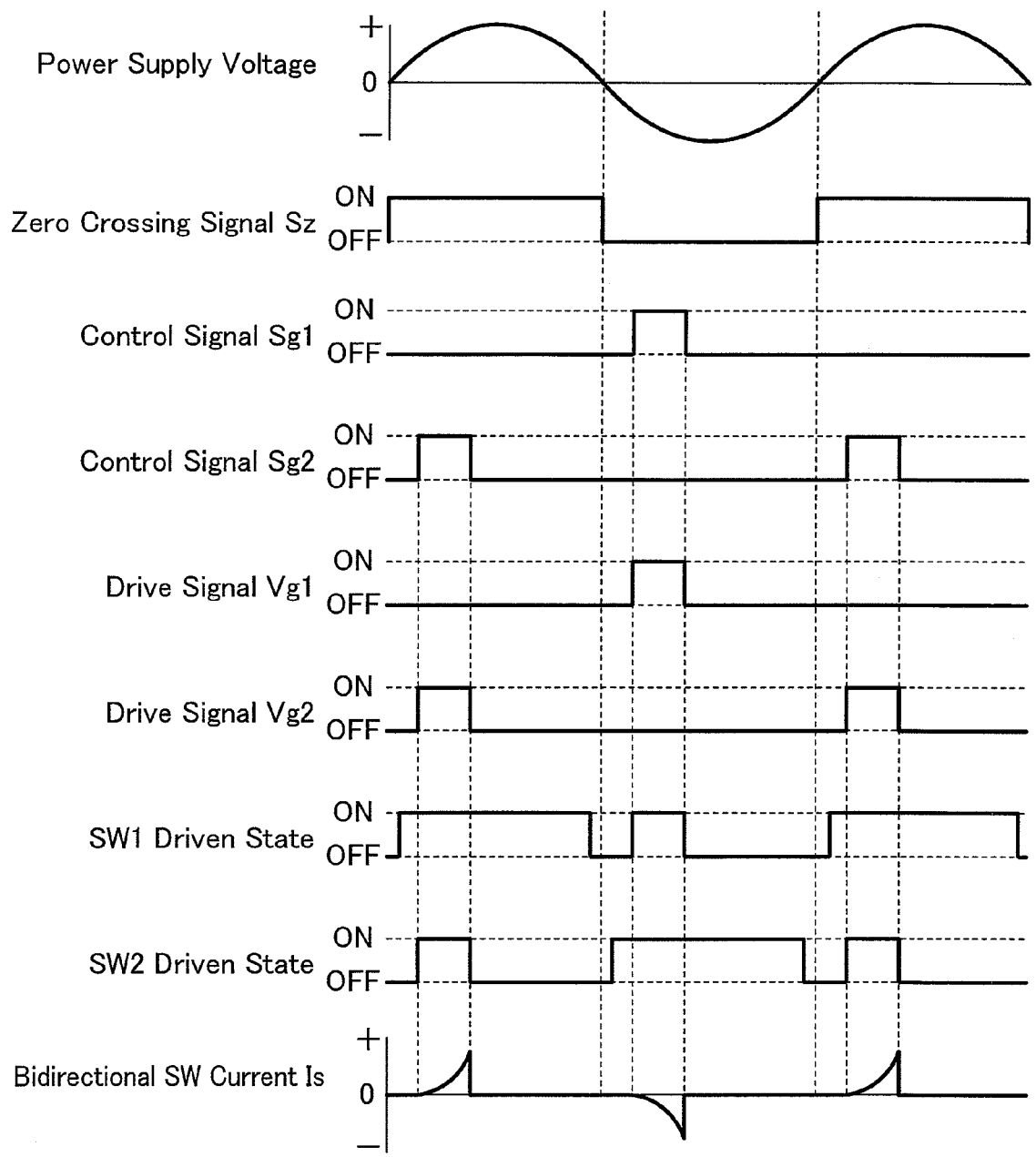
[FIG. 5]

FIG. 5 shows the aforementioned operation of the drive circuits (33, 34) arranged together with a waveform of the power supply voltage, the zero crossing signal Sz, and the like. Note that, in FIG. 5, it is assumed that when the zero crossing signal Sz is on, the reverse voltage is applied to the switching element (SW1) of the bidirectional switch (31), and when the zero crossing signal Sz is off, the reverse voltage is applied to the switching element (SW2).

As shown in FIG. 5, when the reverse voltage is applied to one switching element (SW1, SW2), then if the voltage Vgd, Vdg between the gate (G1, G2) and the drain (D) is higher than or equal to the threshold voltage Vt, the switching element (SW1, SW2) is switched on even without the on-drive signal being input to the switching element (SW1, SW2). In this case, by controlling the driving of the other switching element so that the other switching element is switched on, the current Is can be caused to flow through the bidirectional switch (31).

—Advantages of First Embodiment—

As described above, according to this embodiment, the switching elements (SW1, SW2) of the bidirectional switch (31) are configured so that when a voltage higher than that of the drain (D) is applied to the source (S1) (the reverse voltage is applied), then even if the on-drive signal is not being input to the gate terminal (G1, G2), a current flows from the source (S1) to the drain (D). As a result, the current passage of the bidirectional switch (31) can be controlled by controlling the driving of only one switching element in which a voltage higher than that of the source (S2) is applied to the drain (D). Therefore, the driving of the switching elements (SW1, SW2) of the bidirectional switch (31) can be more easily controlled.

In addition, with the aforementioned configuration, a diode which is conventionally required is no longer required, and therefore, the number of parts can be proportionately reduced, whereby the circuit configuration is simplified and the conduction loss is reduced.

—First Variation of First Embodiment—

Figure 6:
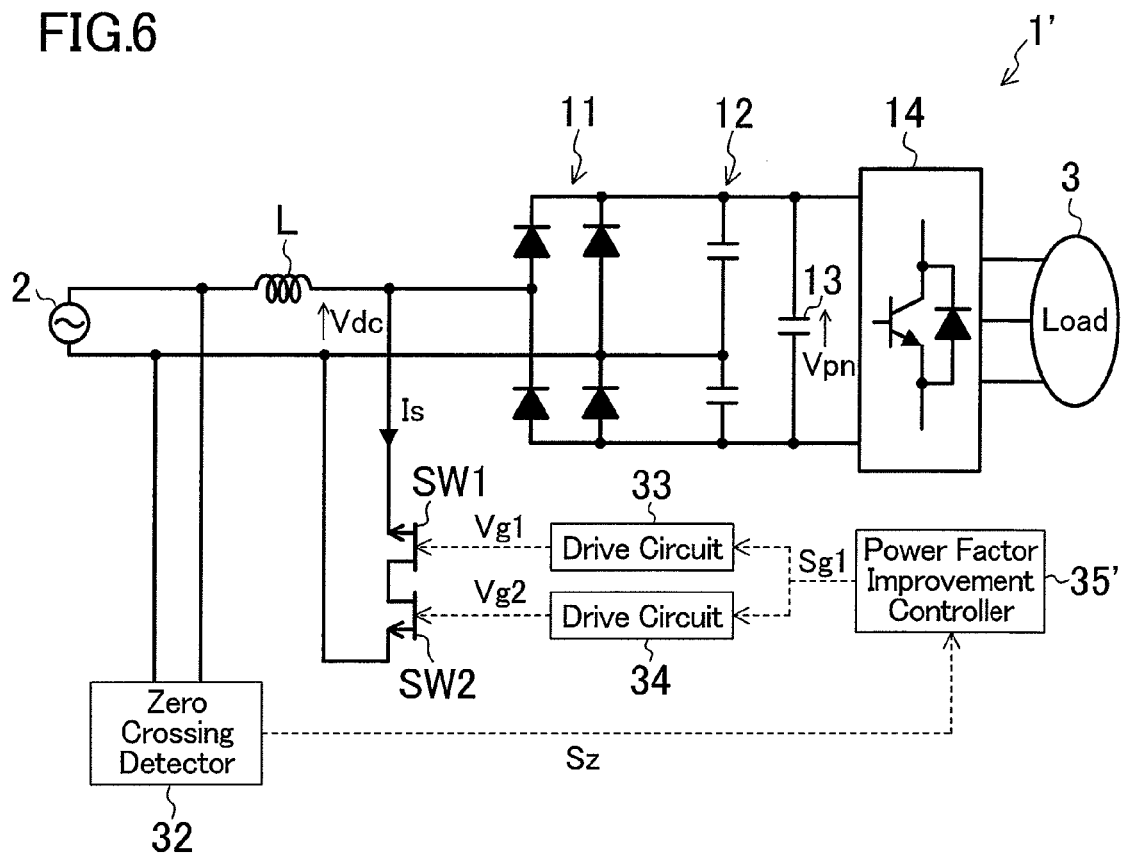
[FIG. 6]

As shown in FIG. 6, this first variation is different from the first embodiment only in that only a single control signal Sg1 is output from a power factor improvement controller (35') of a the power converter (1'), and the same drive signal (Vg1=Vg2) is input to switching elements (SW1, SW2) of a bidirectional switch (31). Therefore, the same parts as those of the first embodiment are indicated by the same reference characters.

Figure 7:
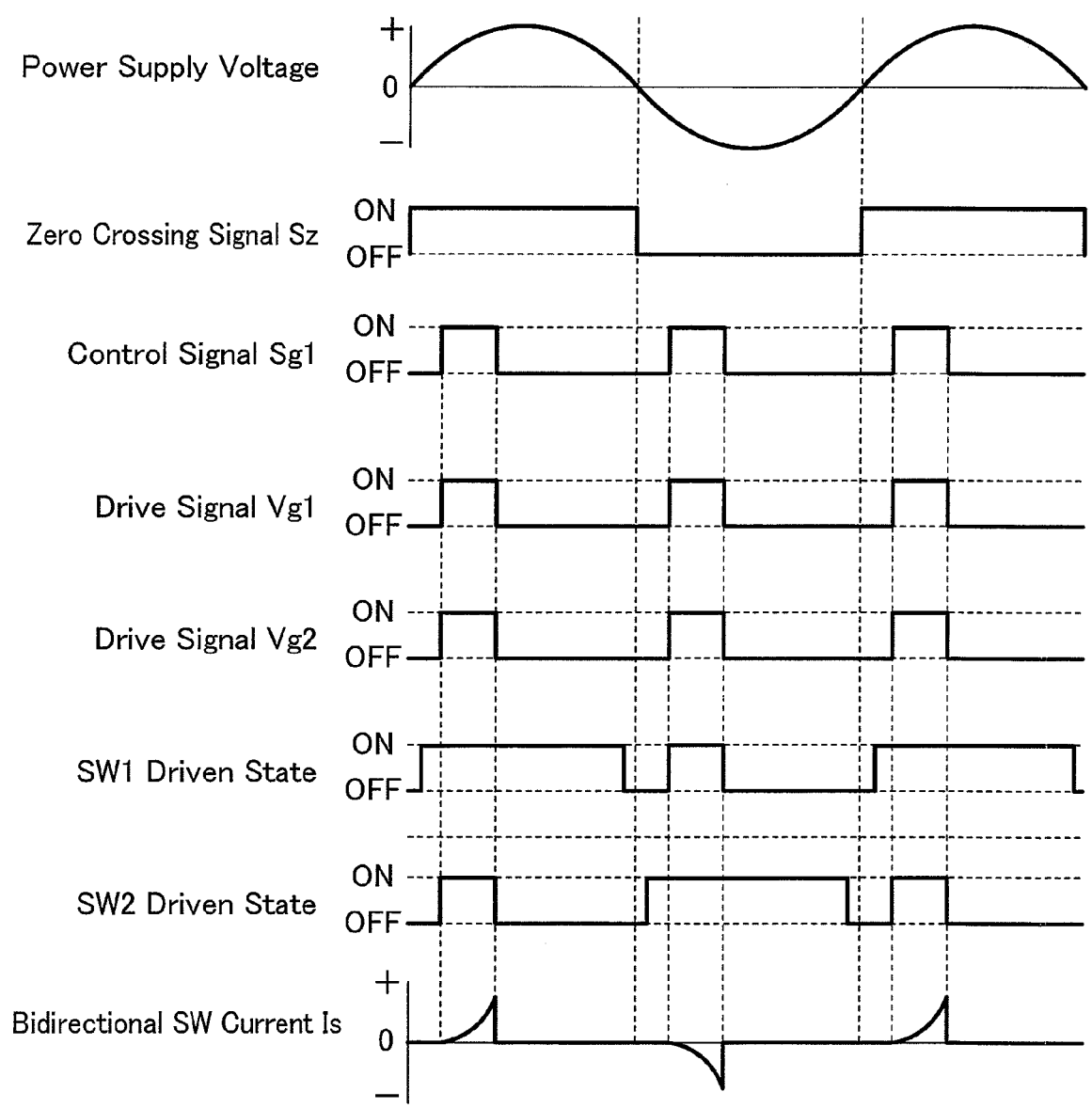
[FIG. 7]

Specifically, as shown in FIG. 6, the power factor improvement controller (35') to which the zero crossing signal Sz is input from the zero crossing detector (32) is configured to output the control signal Sg1 to the drive circuits (33, 34). As a result, the same control signal Sg1 is input to the drive circuits (33, 34), and therefore, as shown in FIG. 7, the drive circuits (33, 34) output the same drive signals Vg1 and Vg2 to the switching elements (SW1, SW2), respectively.

Thus, by inputting the same signal to the two switching elements (SW1, SW2) of the bidirectional switch (31), the switching elements (SW1, SW2) can be more easily controlled than when the driving of the switching element (SW1) and the driving of the switching element (SW2) are separately controlled.

Here, in general, when the same signal is input to the two switching elements (SW1, SW2) of the bidirectional switch (31) as described above, the switching elements (SW1, SW2) may be switched on at different timings due to variations in the performance of the switching elements. However, by employing the switching elements (SW1, SW2) having the configuration of the first embodiment, one switching element to which the reverse voltage is applied is switched to the conductive state irrespective of the drive signal to the gate terminal (G1, G2), whereby damage to the switching element can be reduced or prevented.

—Second Variation of First Embodiment—

Figure 8:
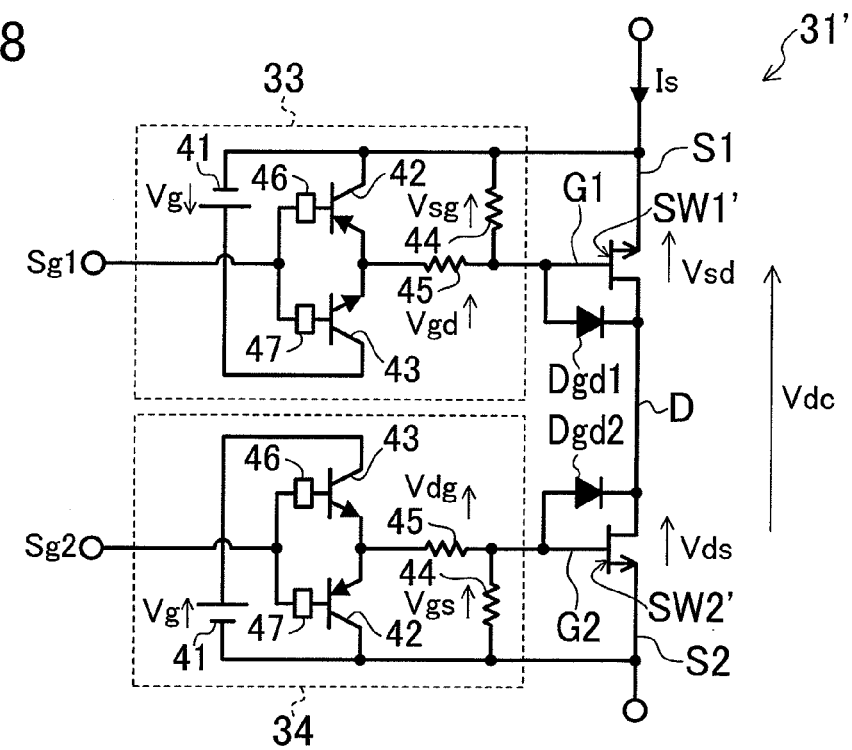
[FIG. 8]

As shown in FIG. 8, this second variation is different from the first embodiment only in that body diodes (Dgd1, Dgd2) are formed between the gates (G1, G2) and drain (D) of two switching elements (SW1', SW2') of a bidirectional switch (31'), and the switching elements (SW1', SW2') are configured so that a current does not flow to the body diodes (Dgd1, Dgd2). Therefore, the same parts as those of the first embodiment are indicated by the same reference characters.

Specifically, as shown in FIG. 8, the switching elements (SW1', SW2') include the body diodes (Dgd1, Dgd2) between the gates (G1, G2) and the drain (D), respectively. The body diodes (Dgd1, Dgd2) conduct a current only from the gate terminals (G1, G2) to the drain (D). In addition, the switching elements (SW1', SW2') are configured so that a threshold voltage Vt at which the switching elements (SW1', SW2') start to be in the on state is lower than a forward voltage Vf of the body diodes (Dgd1, Dgd2).

As a result, before a current flows through the body diode (Dgd1, Dgd2), the switching element (SW1', SW2') is switched on, so that a current flows through the switching element (SW1', SW2'). In general, when a current flows through the body diode (Dgd1, Dgd2), a small number of carriers are accumulated in the body diode (Dgd1, Dgd2), and therefore, a delay occurs when turning off and a relatively large loss occurs when a current flows through the body diode (Dgd1, Dgd2). With the aforementioned configuration, a current is caused to flow through the switching element (SW1', SW2'), whereby the delay and loss when turning off can be reduced or prevented.

—Third Variation of First Embodiment—

Figure 9:
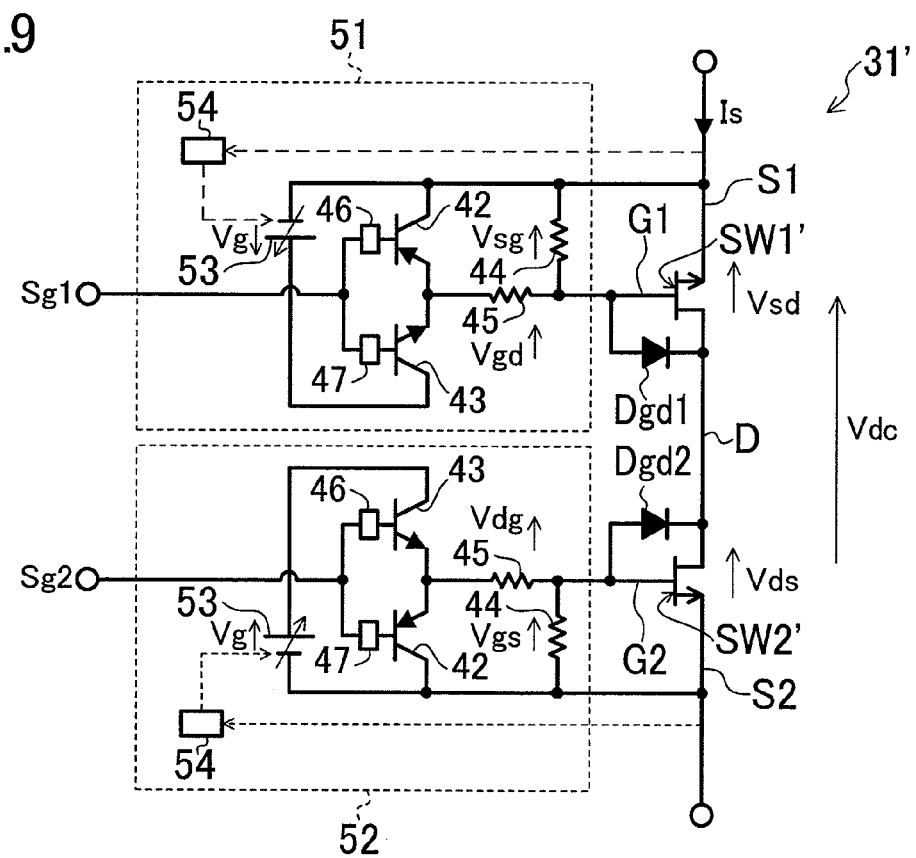
[FIG. 9]

As shown in FIG. 9, this third variation is different from the first embodiment only in that, as in the second variation, body diodes (Dgd1, Dgd2) are formed between the gates (G1, G2) and drain (D) of switching elements (SW1', SW2') of a bidirectional switch (31'), and in that drive power supplies (53) of drive circuits (51, 52) are configured to vary a voltage. Therefore, the same parts as those of the first embodiment are indicated by the same reference characters.

Specifically, as shown in FIG. 9, the switching elements (SW1', SW2') include the body diodes (Dgd1, Dgd2) between the gates (G1, G2) and the drain (D), respectively. The body diodes (Dgd1, Dgd2) conduct a current only from the gate terminals (G1, G2) to the drain (D).

The drive circuits (51, 52) for the switching elements (SW1', SW2') each include the drive power supply (53) configured to vary a voltage. The drive circuits (51, 52) also each include a gate voltage adjuster (54) which calculates the voltage Vgd between the gate (G1, G2) and the drain (D) based on the current Is flowing through the bidirectional switch (31') and adjusts the voltage of the drive power supply (53) so that the voltage Vgd is invariably lower than the forward voltage Vf of the body diode (Dgd1, Dgd2).

Specifically, the voltage Vsd between the source (S1, S2) and the drain (D) varies, depending on the current Is flowing through the bidirectional switch (31') (=Is×Ron (the on-state resistance of the switching element (SW1', SW2'))). Therefore, the gate voltage adjuster (54) is configured to change the voltage Vgs between the gate (G1, G2) and the source (S1, S2) (the voltage of the drive power supply (53)), depending on the voltage Vsd, in order to cause the voltage Vgd between the gate (G1, G2) and the drain (D) to be invariably lower than the forward voltage Vf of the body diode (Dgd1, Dgd2).

As a result, the voltage Vgd between the gate (G1, G2) and the drain (D) of the switching element (SW1', SW2') can be caused to be invariably lower than the forward voltage Vf of the body diode (Dgd1, Dgd2). Therefore, a current can be more reliably prevented from flowing through the body diode (Dgd1, Dgd2), whereby an increase in the delay and the loss when turning off can be more reliably prevented.

—Fourth Variation of First Embodiment—

Figure 10:
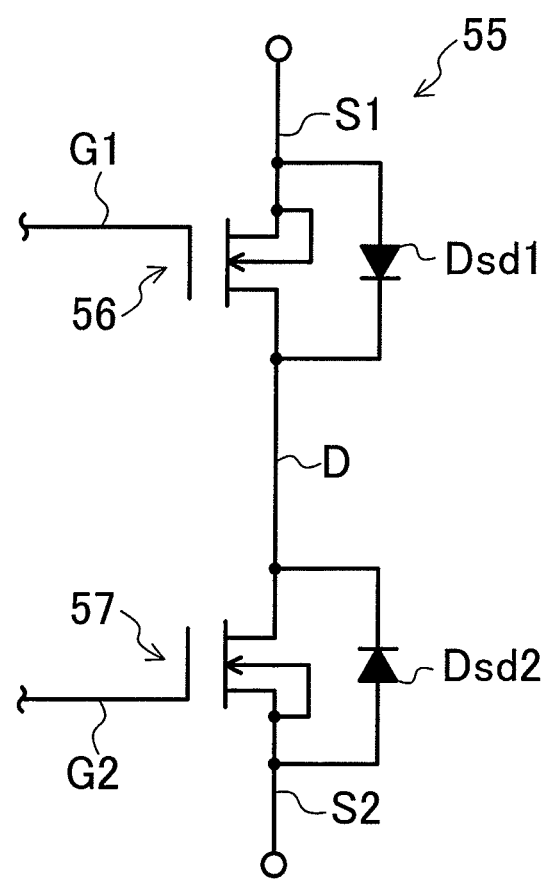
[FIG. 10]

As shown in FIG. 10, this fourth variation is different from the first embodiment only in that body diodes (Dsd1, Dsd2) are formed between the sources (S1, S2) and drain (D) of switching elements (56, 57) of a bidirectional switch (55). Therefore, the same parts as those of the first embodiment are indicated by the same reference characters.

Specifically, the switching elements (56, 57) of the bidirectional switch (55) include the body diodes (Dsd1, Dsd2) between the sources (S1, S2) and the drain (D), respectively. The body diodes (Dsd1, Dsd2) conduct a current only from the gate terminals (S1, S2) to the drain (D). Specifically, the switching elements (56, 57) each include, for example, a MOSFET or the like which includes the body diode (Dsd1, Dsd2) between the source (S1, S2) and the drain (D).

As a result, even when a reverse voltage higher than the voltage of the drain (D) is applied to the source (S1, S2) of the switching element (56, 57), a current can flow through the body diode (Dsd1, Dsd2) until the switching element (56, 57) is switched on, whereby a loss occurring when the switching element (56, 57) is in the off state can be reduced.

Second Embodiment

—Overall Configuration—

Figure 11:
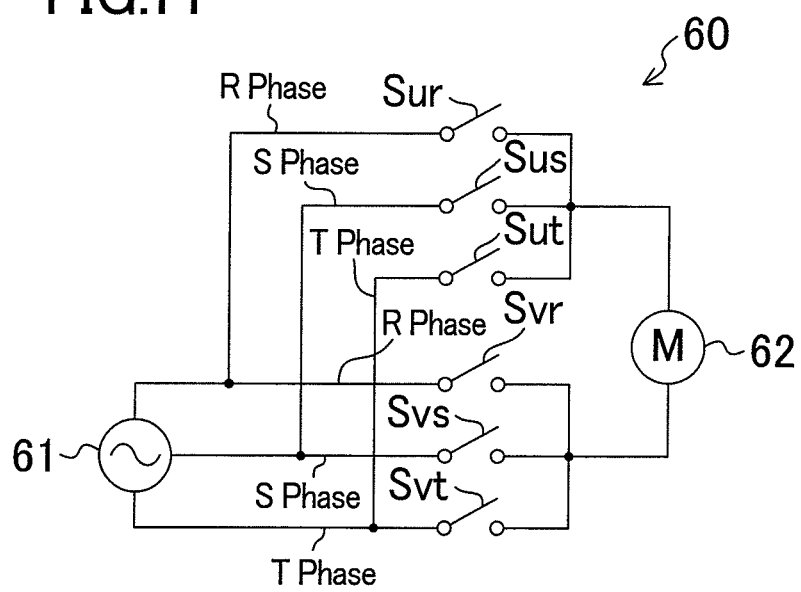
[FIG. 11]

FIG. 11 schematically shows a configuration of a power converter (60) according to a second embodiment of the present invention. The power converter (60) is a so-called matrix converter which directly converts alternating power having a predetermined frequency obtained from an alternating-current power supply (61) to alternating power having another frequency.

The matrix converter (60) includes, as a switching unit, a plurality of (six in the example of FIG. 11) bidirectional switches (Sur, Sus, Sut, Svr, Svs, Svt). Note that, in the example of FIG. 11, the matrix converter (60) is configured to convert alternating power output from a three-phase alternating-current power supply (61) to single-phase alternating power, and supply the resultant power to a load (62), such as a motor or the like. The present invention is not limited to this. The matrix converter (60) may be configured in any manner. For example, the matrix converter (60) may be configured to supply alternating power output from a three-phase alternating-current power supply (61), as it is three-phase alternating power, to a load.

The bidirectional switches (Sur, Sus, Sut, Svr, Svs, Svt) are provided to selectively connect a terminal of each phase of the alternating-current power supply (61) to the two terminals of the load (62). Specifically, three bidirectional switches coupled to the terminals of the three phases of the alternating-current power supply (61) are connected to each of two terminals which are the input and output of the load (62). In the matrix converter (60), the bidirectional switches (Sur, Sus, Sut, Svr, Svs, Svt) provide an R phase, an S phase, and a T phase which are coupled to the respective phases of the alternating-current power supply (61), with respect to the input and output of the load (62).

Figure 12:
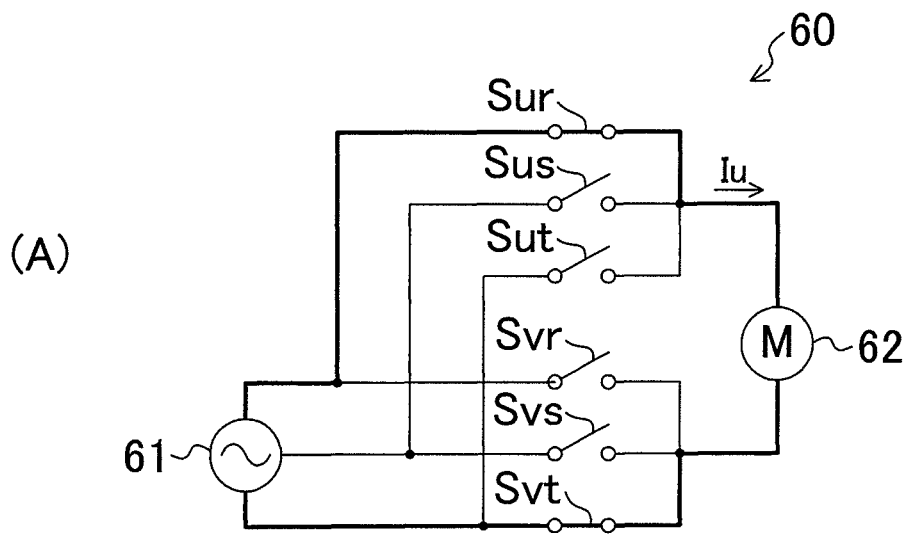
[FIG. 12]
Figure 12:
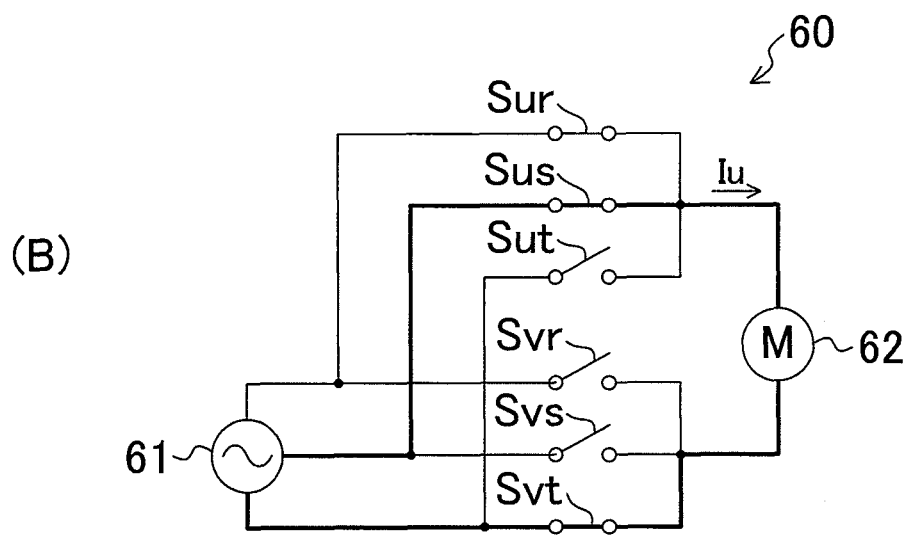

In the matrix converter (60) having the aforementioned configuration, as shown in FIG. 12(A), for example, when the R-phase and T-phase bidirectional switches (Sur, Svt) are switched to the conductive state, a current Iu flows between the R and T phases of the matrix converter (60). Thereafter, as shown in FIG. 12(B), when the R-phase bidirectional switch (Sur) is switched to the non-conductive state and the S-phase bidirectional switch (Sus) is switched to the conductive state, a current flows between the S and T phase of the matrix converter (60). In other words, by performing the switching operation as shown in FIG. 12, the matrix converter (60) performs commutation operation.

—Configuration and Operation of Bidirectional Switch—

A specific configuration of the bidirectional switches (Sur, Sus, Sut, Svr, Svs, Svt) will be described hereinafter. Note that the bidirectional switches (Sur, Sus, Sut, Svr, Svs, Svt) all have the same configuration, and therefore, only the R-phase and S-phase bidirectional switches (Sur, Sus) will be described hereinafter.

Before describing the configuration of the present invention, the configuration and operation of conventional bidirectional switches (Sur', Sus') will be described with reference to FIGS. 13-15.

Figure 13:
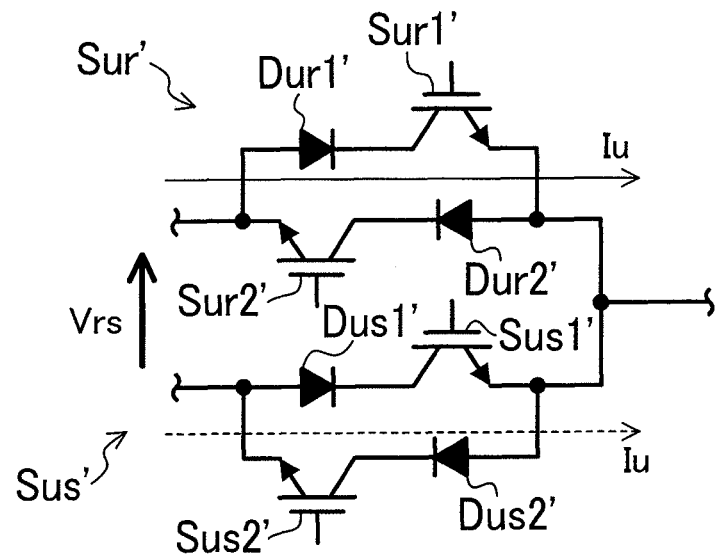
[FIG. 13]

As shown in FIG. 13, in each bidirectional switch (Sur', Sus'), two circuits in each of which a switching element (Sur1', Sur2', Sus1', Sus2') and a diode (Dur1', Dur2', Dus1', Dus2') are connected in series are connected in antiparallel, where the diodes (Dur1', Dur2', Dus1', Dus2') of the two circuits have opposite conduction directions. The diodes (Dur1', Dur2', Dus1', Dus2') are connected in series to the switching elements (Sur1', Sur2', Sus1', Sus2') so that the diodes (Dur1', Dur2', Dus1', Dus2') conduct a current only in the forward direction of the switching elements (Sur1', Sur2', Sus 1', Sus2') (a direction in which a current flows when the voltage of the drain is higher than the voltage of the source). In other words, in the bidirectional switches (Sur', Sus'), two circuits which conduct a current only in one direction are connected in antiparallel, whereby bidirectional conduction is achieved.

Figure 14:
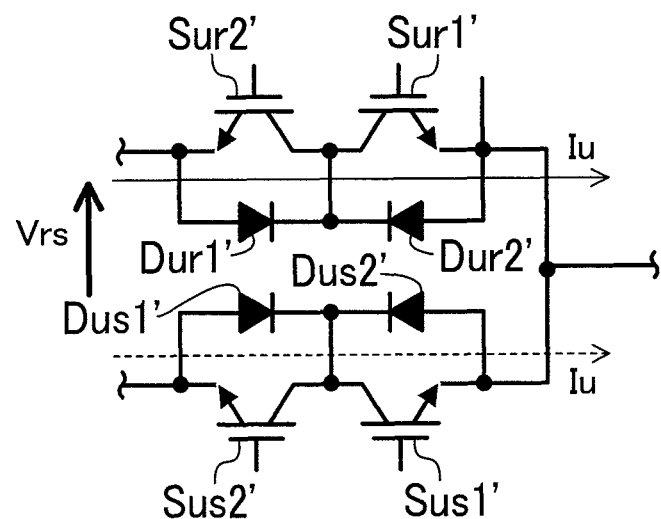
[FIG. 14]
Figure 15:
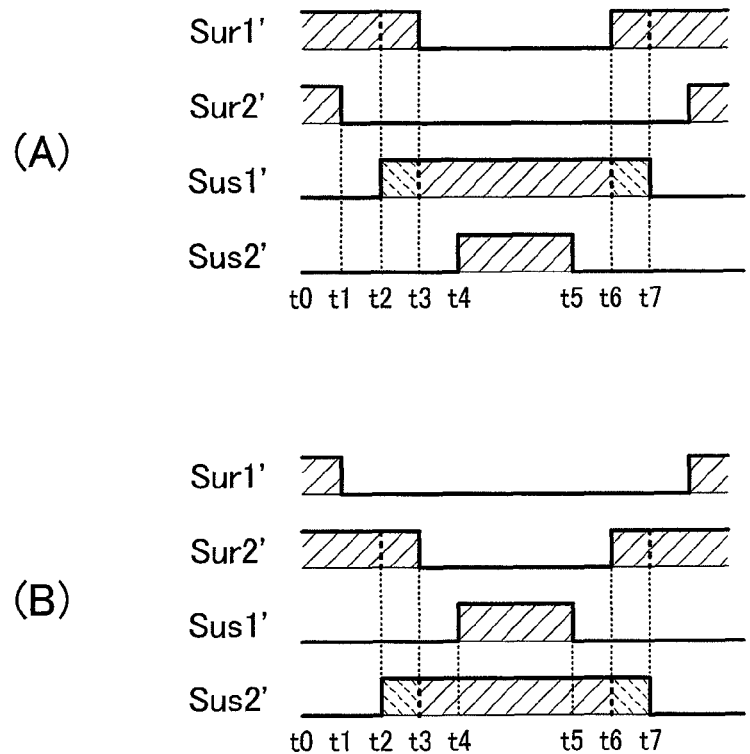
[FIG. 15]

Note that, in addition to the configuration of FIG. 13, the bidirectional switches (Sur', Sus') may have a known configuration shown in FIG. 14 in which two circuits in each of which a switching element (Sur1', Sur2') and a diode (Dur1', Dur2') are connected in antiparallel are connected in series so that a reverse blocking state is established between the switching elements (Sur1', Sur2') and between the diodes (Dur1', Dur2'). In FIGS. 13 and 14, a solid line with an arrow indicates a case where the current Iu flows through the R phase, and a dashed line with an arrow indicates a case where the current Iu flows through the S phase.

Next, operation of the conventional bidirectional switches (Sur', Sus') having the aforementioned configuration will be described along with commutation operation of a matrix converter. Here, FIG. 15 shows operation of the bidirectional switches (Sur', Sus') where commutation operation from the R phase to the S phase is performed. FIG. 15(A) shows operation of the bidirectional switches (Sur', Sus') where the current Iu has a positive value, and FIG. 15(B) shows operation of the bidirectional switches (Sur', Sus') where the current Iu has a negative value. In FIG. 15, solid hatching indicates cases where a current is allowed to pass when a voltage higher than that of the S phase is being applied to the R phase, and dashed hatching indicates cases where one switching element is switched off and the other switching element is switched on when a voltage higher than that of the R phase is being applied to the S phase.

Note that, although not shown, the matrix converter includes a voltage polarity detector which detects the polarity of the voltage of the alternating-current power supply or a current polarity detector which detects the polarity of the current. Based on the result of detection, the matrix converter determines timings (t0-t7) of switching operation of the bidirectional switches (Sur', Sus').

Firstly, it is assumed that the current Iu has a positive value. As shown in FIG. 15(A), at t=t0, the switching element (Sur1') is in the on state, and the current Iu is flowing through the R phase. In this case, the other switching element (Sur2')

of the R-phase bidirectional switch (Sur') is also in the on state. This is in order to, when a short circuit failure or the like occurs in the load (62), cause a current to flow in the reverse direction as well, thereby preventing the failure of the matrix converter.

The current Iu is commutated from the R phase to the S phase as follows. Initially, at t=t1, the switching element (Sur2') is switched off. Thereafter, at t=t2, the driving of the switching element (Sus1') of the S-phase bidirectional switch (Sus') is controlled so that the switching element (Sus1') of the S-phase bidirectional switch (Sus') is switched on. In this case, if a voltage higher than that of the S phase is being input to the R phase (Vrs>0), the current Iu continues to flow though the R phase (a solid-line portion of Sur1'). If a voltage higher than that of the R phase is being input to the S phase (Vrs<0), the phase through which the current Iu flows is changed from the R phase to the S phase (from a solid-line portion of Sur1' to a dashed-line portion of Sus1'). At t=t3, when the switching element (Sur1') is switched off, then even if Vrs>0, the phase through which the current Iu flows is changed from the R phase to the S phase (from a solid-line portion of Sur1' to a solid-line portion of Sus1').

Thus, the current Iu flowing through the R-phase can be commutated to the S phase. Thereafter, at t=t4, the driving of the other switching element (Sus2') of the S-phase bidirectional switch (Sus') is also controlled so that the other switching element (Sus2') of the S-phase bidirectional switch (Sus') is switched on, whereby a current can flow in the reverse direction as well when a failure or the like occurs.

Conversely, the current Iu is commutated from the S phase back to the R phase as follows. Initially, at t=t5, the switching element (Sus2') is switched off. Thereafter, at t=t6, the driving of the switching element (Sur1') of the R-phase bidirectional switch (Sur') is controlled so that the switching element (Sur1') of the R-phase bidirectional switch (Sur') is switched on. In this case, if a voltage higher than that of the S phase is being applied to the R phase (Vrs>0), the phase through which the current Iu flows is changed from the S phase to the R phase (from a solid-line portion of Sus1' to a solid-line portion of Sur1'). If a voltage higher than that of the R phase is being applied to the S phase (Vrs<0), the phase through which the current Iu flows continues to be the S phase (a dashed-line portion of SuS1'). At t=t7, when the switching element (Sus1') is switched off, then even if Vrs<0, the phase through which the current Iu flows is changed from the S phase to the R phase (from a dashed-line portion of Sus1' to a solid-line portion of Sur1'). As a result, the operation of commutating the current Iu from the S phase to the R phase is completed.

In the aforementioned commutation operation, if the operation of the switching elements (Sur1', Sus1') and the operation of the switching elements (Sur2', Sus2') are reversed, the commutation operation of FIG. 15(B) is achieved.

Incidentally, in the bidirectional switches (Sur', Sus') having the aforementioned configuration, reverse blocking diodes (Dur1', Dur2', Dus1', Dus2') which prevent a current from flowing in the reverse direction are required in addition to the switching elements (Sur1', Sur2', Sus1', Sus2'). Therefore, the number of parts increases and the circuit configuration is more complicated, whereby the conduction loss proportionately increases. To avoid this, a configuration employing reverse blocking IGBTs which remove the necessity of the diodes (Dur1', Dur2', Dus1', Dus2') may be contemplated. However, in order to prevent the breakdown of the switching elements, it is necessary to control the driving of the switching elements in a well-coordinated manner, i.e., a highly accurate and complicated control is required.

In contrast to this, in this embodiment, in order to provide a bidirectional switch for a matrix converter which can be implemented by simply controlling the driving of switching elements while reducing the number of parts to simplify the circuit and reduce the conduction loss, a device which is configured so that when a voltage higher than that of the drain is applied to the source, a current is allowed to pass from the source to the drain even if the on-drive signal is not being input to the gate terminal, is employed as the switching element of the bidirectional switch.

Figure 16:
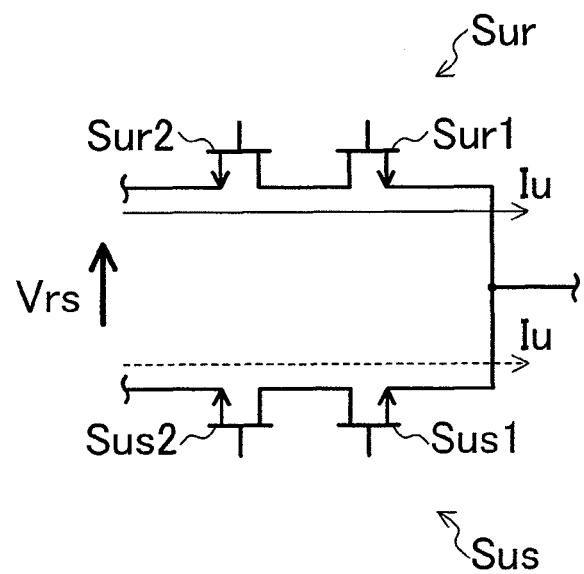
[FIG. 16]

Specifically, as shown in FIG. 16, in the bidirectional switches (Sur, Sus) of the matrix converter (60), two switching elements (Sur1, Sur2, Sus1, Sus2) are connected in series so that the drains thereof are coupled to each other. Each switching element (Sur1, Sur2, Sus1, Sus2) is configured so that when a voltage higher than that of the drain is applied to the source, then even if the on-drive signal is not being input to the gate terminal, a current is allowed to pass from the source to the drain. The switching elements (SW1, SW2) include, for example, a junction field-effect transistor, a static induction transistor, a metal-semiconductor field-effect transistor, a heterojunction field-effect transistor, a high electron mobility transistor, or the like. In FIG. 16, a solid line with an arrow indicates a case where the current Iu flows through the R phase, and a dashed line with an arrow indicates a case where the current Iu flows through the S phase.

Here, as with the switching elements (SW1, SW2) of the first embodiment, the two switching elements (Sur1, Sur2, Sus1, Sus2) constituting each bidirectional switch (Sur, Sus) may be configured as a so-called dual-gate type device which includes two source terminals (S1, S2) and two gate terminals (G1, G2), and a single common drain (D), or alternatively, may be configured as two separate devices.

The on-state resistance Ron of the switching elements (Sur1, Sur2, Sus1, Sus2) is set so that the on-state voltage generated by the reverse current flowing the source to the drain is higher than the threshold voltage Vt. As a result, the gate-drain voltage can more quickly reach the threshold voltage Vt or more. Therefore, the switching elements (Sur1, Sur2, Sus1, Sus2) can be more quickly driven to turn on, whereby a loss occurring when a current passes in the reverse direction can be reduced. Note that, in transistors, such as junction field-effect transistors, static induction transistors, and the like, the threshold voltage is lower than or equal to 2.5 V, and therefore, the on-state resistance can be caused to be relatively small, whereby the conduction loss of the switching element can be reduced.

As a result, although details will be described later, of the switching elements (Sur1, Sur2, Sus1, Sus2), a switching element in which a higher voltage is applied to the source is switched on which allows a current to pass in the reverse direction by the reverse voltage applied to the switching element, without controlling the driving of the switching element so that the switching element is switched on.

The drive circuits for the switching elements (Sur1, Sur2, Sus1, Sus2) are similar to those of the first embodiment. Specifically, in FIG. 3 of the first embodiment, the switching elements (SW1, SW2) correspond to the switching elements (Sur2, Sus2) and the switching elements (Sur1, Sus1) of this embodiment, respectively.

Figure 17:
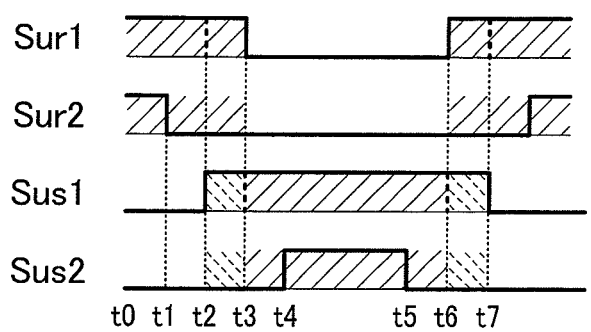
[FIG. 17]
Figure 17:
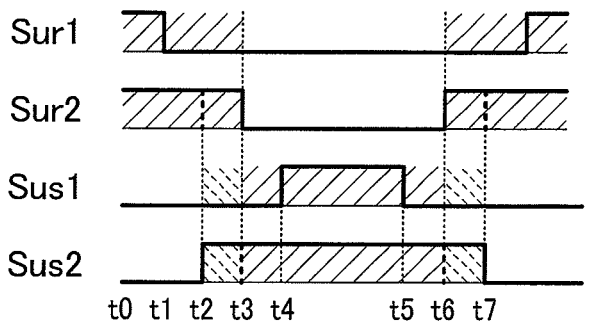

Operation of the bidirectional switches (Sur, Sus) including the switching elements (Sur1, Sur2, Sus1, Sus2) having the aforementioned configuration will be described along with commutation operation of the matrix converter. Here, FIG. 17 shows operation of the bidirectional switches (Sur, Sus) when commutation operation from the R phase to the S phase is performed. FIG. 17(A) shows operation of the bidirectional switches (Sur, Sus) where the current Iu has a positive value, and FIG. 17(B) shows operation of the bidirectional switches (Sur, Sus) where the current Iu has a negative value. Note that, in FIG. 17, solid hatching indicates cases where a current is allowed to pass when a voltage higher than that of the S phase is being applied to the R phase, and dashed hatching indicates cases where a current is allowed to pass when a voltage higher than that of the R phase is being applied to the S phase.

Note that, although not shown, the matrix converter includes a voltage polarity detector which detects the polarity of the voltage of the alternating-current power supply or a current polarity detector which detects the polarity of the current. Based on the result of detection, the matrix converter determines timings (t0-t7) of switching operation of the bidirectional switches (Sur, Sus).

Firstly, it is assumed that the current Iu has a positive value. As shown in FIG. 17(A), at t=t0, the switching element (Sur1) is in the on state, and the current Iu is flowing through the R phase. In this case, the other switching element (Sur2) of the R-phase bidirectional switch (Sur) is also in the on state.

The current Iu is commutated from the R phase to the S phase as follows. Initially, at t=t1, the switching element (Sur2) is switched off. However, the reverse voltage is being applied to the switching element (Sur2). Therefore, even when the on-drive signal is not being input to the gate terminal of the switching element (Sur2), the current Iu flows through the switching element (Sur2) when the voltage continues to be applied to the R phase.

Thereafter, at t=t2, the driving of the switching element (Sus1) of the S-phase bidirectional switch (Sus) is controlled so that the switching element (Sus1) of the S-phase bidirectional switch (Sus) is switched on. In this case, if a voltage higher than that of the S phase is being applied to the R phase (Vrs>0), the current Iu continues to flow through the R phase (a solid-line portion of Sur1). If a voltage higher than that of the R phase is being applied to the S phase (Vrs<0), the phase through which the current Iu flows is changed from the R phase to the S phase (from a solid-line portion Sur1 to a dashed-line portion of Sus1). At t=t3, when the switching element (Sur1) is switched off, then even if Vrs>0, the phase through which the current Iu flows is changed from the R phase to the S phase (from a solid-line portion of Sur1 to a solid-line portion of Sus1). Here, as described above, when only the switching element (Sus1) of the S-phase bidirectional switch (Sus) is switched on, so that a voltage which allows the current Iu to flow through the S phase is applied, the reverse voltage is applied to the other switching element (Sus2) of the S-phase bidirectional switch (Sus). Therefore, in this case, even when the on-drive signal is not input to the gate terminal of the switching element (Sus2), a current is allowed to pass through the switching element (Sus2), i.e, the current Iu flows through the S phase.

Thus, the current Iu can be commutated from the R phase to the S phase. Thereafter, at t=t4, the driving of the other switching element (Sus2) of the S-phase bidirectional switch (Sus) is also controlled so that the other switching element (Sus2) of the S-phase bidirectional switch (Sus) is switched on, whereby the conduction loss of the switching element (Sus2) is reduced.

Conversely, the current Iu is commutated from the S phase back to the R phase as follows. Initially, at t=t5, the switching element (Sur2) is switched off. In this case, the reverse voltage is being applied to the switching element (Sus2). Therefore, even when the on-drive signal is not being input to the gate terminal of the switching element (Sus2), the current Iu flows through the switching element (Sus2) when the voltage continues to be applied to the S phase.

Thereafter, at t=t6, the driving of the switching element (Sur1) of the R-phase bidirectional switch (Sur) is controlled so that the switching element (Sur1) of the R-phase bidirectional switch (Sur) is switched on. In this case, if a voltage higher than that of the S phase is being applied to the R phase (Vrs>0), the phase through which the current Iu flows is changed from the S phase to the R phase (from a solid-line portion of Sus1 to a solid-line portion of Sur1). If a voltage higher than that of the R phase is being applied to the S phase (Vrs<0), the phase through which the current Iu flows continues to be the S-phase (a dashed-line portion of Sus1). At t=t7, when the switching element (Sus1) is switched off, then even if Vrs<0, the phase through which the current Iu flows is changed from the S phase to the R phase (from a dashed-line portion of Sus1 to the solid-line portion of Sur1). Here, as described above, when the switching element (Sur1) of the R-phase bidirectional switch (Sur) is switched on, so that a voltage which allows the current Iu to flow through the R phase is applied, the reverse voltage is applied to the other switching element (Sur2) of the R-phase bidirectional switch (Sur). Therefore, in this case, even when the on-drive signal is not input to the gate terminal of the switching element (Sur2), the switching element (Sur2) is switched on, so that the current Iu flows through the R phase. As a result, the operation of commutating the current Iu from the S phase to the R phase is completed.

In the aforementioned commutation operation, if the operation of the switching elements (Sur1, Sus1) and the operation of the switching elements (Sur2, Sus2) are reversed, the commutation operation of FIG. 17(B) is achieved.

Note that, also in this embodiment, a configuration similar to those of the first to fourth variations of the first embodiment may be employed as in the first embodiment.

—Advantages of Second Embodiment—

As described above, according to this embodiment, the switching elements (Sur1, Sur2, Sus1, Sus2) constituting the bidirectional switches (Sur, Sus) of the matrix converter (60) are configured so that when a voltage higher than that of the drain is applied to the source, then even if the on-drive signal is not being input to the gate terminal, a current is allowed to pass from the source to the drain. As a result, the number of parts can be reduced by removing the reverse blocking diodes, and therefore, the size and cost can be proportionately reduced, and the conduction loss can be reduced.

In addition, as described above, the switching elements (Sur1, Sur2, Sus1, Sus2) to which the reverse voltage is applied can be caused to conduct a current even without controlling the driving of the switching elements. Therefore, it is no longer necessary to control all the switching elements (Sur1, Sur2, Sus1, Sus2) in a well-coordinated manner, whereby the control is facilitated.

Other Embodiments

The aforementioned embodiments may be configured as follows.

In the first embodiment, the on-drive signal is not input to the gate terminal of the switching element (SW1) in which a voltage higher than that of the drain is applied to the source. The present invention is not limited to this. When it is detected or inferred that a reverse current is flowing through the switching element (SW1), the on-drive signal may be input to the gate terminal of the switching element (SW1). In this case, the switching element (SW1) can be driven into the conductive state, and therefore, the conduction loss can be further reduced than when a current is allowed to pass through the switching element (SW1) which is not driven. Also in the second embodiment, when it is detected or inferred that a reverse current is flowing through the switching element (Sur2, Sus2), the on-drive signal may be quickly input to the switching element (Sur2, Sus2).

INDUSTRIAL APPLICABILITY

The present invention is particularly useful for power converters including a bidirectional switch in which a plurality of switching elements are connected in series.

DESCRIPTION OF REFERENCE CHARACTERS

1 Power Converter
15 Power Factor Improvement Circuit
30 Bidirectional Switch Circuit
31, 31', 55, Sur, Sus Bidirectional Switch (Switching Unit)
32 Zero Crossing Detector
33 Drive Circuit (Gate Drive Circuit)
34 Drive Circuit
35, 35' Power Factor Improvement Controller (Controller)
41 Drive Power Supply
42, 43 Gate Drive Switching Element
44 Resistor (Resistance Material)
45 Resistor
46, 47 Drive Controller
51, 52 Drive Circuit
53 Drive Power Supply
54 Gate Voltage Adjuster
56, 57 Switching Element
60 Power Converter (Matrix Converter)
Dgd1, Dgd2 Body Diode
L Reactor
SW1, SW2, SW1', SW2' Switching Element
S1, S2 Source
D Drain
G1, G2 Gate Terminal

The invention claimed is:

1. A bidirectional switch circuit comprising:
two switching elements connected to conduct a current in both directions, wherein
the two switching elements are connected in series to each other at drains,
of the two switching elements, the switching element to which a reverse voltage is applied, a voltage of a source of one of the switching elements being higher than a voltage of a drain of the one of the switching elements, is configured to conduct a current from the source to the drain even when an on-drive signal is not being input to a gate terminal of the one of the switching elements,
the bidirectional switch circuit further comprises
a gate drive circuit provided for each of the two switching elements, and configured to control, if a gate-to-source potential of one of the switching elements is controlled to be a first potential such that the one of the switching elements is turned on, a gate-to-source potential of the other of the switching elements such that the gate-to-source potential of the other of the switching elements is different from the first potential,
the gate drive circuit comprises
a resistance material connected between the source and the gate terminal of the switching element and in parallel to the switching element,
the resistance material has a resistance value which is smaller than that of the two switching elements, and
the two switching elements do not include a parasitic diode and an external diode each of which is located between the source and the drain and is capable of conducting a current from the source to the drain.

2. The bidirectional switch circuit of claim 1, wherein
the switching element to which the reverse voltage is applied includes a gate-drain body diode provided between the gate terminal and the drain and configured to allow a current to flow only from the gate terminal to the drain, and
the switching element is configured so that a threshold voltage at which the switching element starts to be in an on state is lower than a forward voltage of the gate-drain body diode.

3. The bidirectional switch circuit of claim 1, wherein
the switching element to which the reverse voltage is applied includes a gate-drain body diode provided between the gate terminal and the drain and configured to allow a current to flow only from the gate terminal to the drain, and
the gate drive circuit includes a gate voltage adjuster configured to adjust a gate-drain voltage between the gate terminal and the drain so that the gate-drain voltage is lower than a forward voltage of the gate-drain body diode.

4. The bidirectional switch circuit of claim 1, further comprising:
a control circuit configured to output an off-control signal to the switching element to which the reverse voltage is applied.

5. The bidirectional switch circuit of claim 1, wherein the two switching elements are provided in a single device including two gate electrodes.

6. The bidirectional switch circuit of claim 5, wherein a distance between the two gate electrodes is greater than distances between the gate electrodes and the respective corresponding source electrodes.

7. A power converter, wherein the power converter is a matrix converter including the bidirectional switch circuit of claim 1 as a switching unit.

8. The power converter of claim 7, wherein two switching elements constituting the switching unit of the matrix converter are provided in a single device having two gate electrodes.

9. The power converter of claim 8, wherein a distance between the two gate electrodes is greater than distances between the gate electrodes and the respective corresponding source electrodes.

10. A power converter comprising:
the bidirectional switch circuit of claim 1 as a switching unit.

11. The bidirectional switch circuit of claim 1, wherein the drain is a common drain for the two switching elements.

12. The bidirectional switch circuit of claim 1, wherein
the gate drive circuit further includes a first gate drive switching element and a second gate drive switching element connected in series,
the first gate drive switching element is provided between a drive power supply and the gate terminal of the each of the two switching elements, and the second gate drive switching element is provided to couple the source and the gate terminal of the each of the two switching elements.

13. The bidirectional switch circuit of claim 12, wherein a resistor connected in series to the resistance material is provided between the gate terminal of the each of the two switching elements and the first and second gate drive switching elements.

* * * * *